(12) United States Patent
Best et al.

(10) Patent No.: US 12,743,025 B2
(45) Date of Patent: Sep. 22, 2026

(54) SUBSTRATE EDGE PATTERNING TECHNIQUES

(71) Applicant: Onto Innovation Inc., Wilmington, MA (US)

(72) Inventors: Keith F. Best, Andover, MA (US); Mark Howard, Dorchester, MA (US); Douglas A. Brown, Wilmington, MA (US); Guray Tas, Plaistow, NH (US)

(73) Assignee: Onto Innovation Inc., Wilmington, MA (US)

( * ) Notice: Subject to any disclaimer, the term of this patent is extended or adjusted under 35 U.S.C. 154(b) by 71 days.

(21) Appl. No.: 18/398,919

(22) Filed: Dec. 28, 2023

(65) Prior Publication Data

US 2024/0319615 A1 Sep. 26, 2024

Related U.S. Application Data

(60) Provisional application No. 63/491,252, filed on Mar. 20, 2023.

(51) Int. Cl.
*G03F 7/00* (2006.01)
*H10P 76/20* (2026.01)

(52) U.S. Cl.
CPC .......... *G03F 7/70616* (2013.01); *G03F 7/705* (2013.01); *G03F 7/7085* (2013.01); *H10P 76/2041* (2026.01)

(58) Field of Classification Search
CPC . H01L 21/0274; G03F 7/705; G03F 7/70616; G03F 7/7085
See application file for complete search history.

(56) References Cited

U.S. PATENT DOCUMENTS 5,168,021 A * 12/1992 Arai ........................ G03F 7/168 430/30
5,168,304 A * 12/1992 Hattori .................. G03F 7/2022 355/71

(Continued)

FOREIGN PATENT DOCUMENTS

| CN | 107102515 | 6/2020 |
|---|---|---|
| JP | H06283406 | 10/1994 |

(Continued)

OTHER PUBLICATIONS

"International Application Serial No. PCT US2024 019734, International Search Report mailed Jul. 18, 2024", 4 pages.

(Continued)

*Primary Examiner* — Deoram Persaud
(74) *Attorney, Agent, or Firm* — Schwegman Lundberg & Woessner, P.A.

(57) ABSTRACT

Various techniques to quickly image one or more edge regions of a substrate panel without imaging other regions of the substrate panel, such as areas of the substrate panel that have already been exposed to ultraviolet (UV) light. In some examples, an illumination mask assembly can be coupled to a clamp assembly and used to image at least one edge region of the substrate panel, such as an edge region including one or more dummy patterns. For example, the substrate panel can be clamped using the clamp assembly in order to immerse the substrate panel into a plating bath. Before immersion, the illumination mask assembly can image one or more edge regions of the substrate panel, such as to image the various dummy patterns in a layer of the substrate panel.

23 Claims, 5 Drawing Sheets

(56) References Cited

U.S. PATENT DOCUMENTS

| | | | | | |
|---|---|---|---|---|---|
| 5,811,211 | A * | 9/1998 | Tanaka | G03F 7/2022 | 430/311 |
| 5,880,816 | A * | 3/1999 | Mimura | G03F 7/2028 | 356/612 |
| 5,982,474 | A * | 11/1999 | Akiyama | G03F 7/2026 | 355/53 |
| 7,161,662 | B2 | 1/2007 | Ottens et al. | | |
| 7,681,519 | B2 * | 3/2010 | Hong | G03F 7/168 | 118/58 |
| 7,713,663 | B2 | 5/2010 | Okubo et al. | | |
| 7,795,601 | B2 | 9/2010 | Lin et al. | | |
| 8,212,989 | B2 | 7/2012 | Thallner | | |
| 8,625,076 | B2 | 1/2014 | Chien et al. | | |
| 9,081,149 | B2 * | 7/2015 | Wu | G03F 7/2028 | |
| 9,891,529 | B2 * | 2/2018 | Li | G03F 7/70991 | |
| 11,822,261 | B2 * | 11/2023 | Liang | G03F 7/2022 | |
| 2002/0064729 | A1 | 5/2002 | Ching et al. | | |
| 2004/0004700 | A1 | 1/2004 | Park et al. | | |
| 2007/0196986 | A1 | 8/2007 | Ichige et al. | | |
| 2007/0267759 | A1 | 11/2007 | Liao et al. | | |
| 2008/0204685 | A1 * | 8/2008 | Kono | G03F 7/70466 | 355/53 |
| 2008/0252871 | A1 | 10/2008 | Sato et al. | | |
| 2009/0268184 | A1 | 10/2009 | Lin et al. | | |
| 2010/0248153 | A1 | 9/2010 | Lee et al. | | |
| 2010/0285399 | A1 * | 11/2010 | Huang | G03F 7/70425 | 430/311 |
| 2012/0320359 | A1 | 12/2012 | Van Zwet et al. | | |
| 2013/0292162 | A1 | 11/2013 | Lee et al. | | |
| 2013/0293861 | A1 | 11/2013 | Deguenther | | |
| 2019/0109034 | A1 * | 4/2019 | Fehkuhrer | H10P 72/74 | |
| 2023/0161263 | A1 | 5/2023 | De Boeij et al. | | |

FOREIGN PATENT DOCUMENTS

| | | |
|---|---|---|
| JP | 2000091184 | 3/2000 |
| JP | 2007194583 | 8/2007 |
| JP | 4495019 | 4/2010 |
| JP | 2013232576 | 11/2013 |
| KR | 20090044523 | 5/2009 |
| KR | 20150005522 | 1/2015 |
| KR | 20160103927 | 9/2016 |
| TW | 202439037 | 10/2024 |
| WO | 2023089197 | 5/2023 |
| WO | 2024196668 | 9/2024 |

OTHER PUBLICATIONS

"International Application Serial No. PCT US2024 019734, Written Opinion mailed Jul. 18, 2024", 5 pages.

"Taiwanese Application Serial No. 113109945, Office Action mailed Oct. 14, 2024", with English claims, 13 pages.

Baek, Seunghwa, "Resolution enhancement using plasmonic metamask for wafer-scale photolithography in the far field", Scientific Reports vol. 6 Article No. 30476, (Jul. 26, 2016), 8 pages.

"Taiwanese Application Serial No. 113109945, Response filed Jan. 13, 2025 to Office Action mailed Oct. 14, 2024", with English claims, 11 pages.

"U.S. Appl. No. 17/990,680, Preliminary Amendment filed Nov. 19, 2022", 5 pgs.

"International Application Serial No. PCT EP2022 082809, International Search Report mailed Mar. 14, 2023", 4 pgs.

"U.S. Appl. No. 17/990,680, Preliminary Amendment filed May 3, 2023", 9 pgs.

"U.S. Appl. No. 17/990,680, Restriction Requirement mailed May 29, 2025", 5 pgs.

"U.S. Appl. No. 17/990,680, Response filed Jul. 29, 2025 to Restriction Requirement mailed May 29, 2025", 11 pgs.

"U.S. Appl. No. 18/262,495, Non Final Office Action mailed Aug. 18, 2025", 12 pgs.

"International Application Serial No. PCT US2024 019734, International Preliminary Report on Patentability mailed Oct. 2, 2025", 7 pgs.

* cited by examiner 400
408A
502A
504A
504B
502B
408B
416
102
402

SUBSTRATE EDGE PATTERNING TECHNIQUES

CROSS-REFERENCE TO RELATED APPLICATION

This application claims the benefit of priority to U.S. Provisional Patent Application Ser. No. 63/491,252, filed Mar. 20, 2023, the contents of which are incorporated herein by reference in its entirety.

FIELD OF THE DISCLOSURE

This disclosure relates generally to semiconductor devices and more particularly to techniques for fabricating semiconductor devices.

BACKGROUND

Semiconductor devices are an essential component of modern electronic and computing devices. Semiconductors devices are electronic components that exploit the electrical properties of semiconductor materials. The electrical conductivity of semiconductor materials can be manipulated by the introduction of an electric or magnetic field. Improvements in the manufacturing process have resulted in exponential improvements in the size, speed, and cost of semiconductor devices.

In a typical semiconductor manufacturing process, bare whole wafers or panels are processed using lithographic techniques to create circuitry thereon. These substrates with circuitry are often then separated into smaller pieces known as die. These dies form the basis of common electronic devices.

SUMMARY OF THE DISCLOSURE

This disclosure describes various techniques to quickly image one or more edge regions of a substrate panel without imaging other regions of the substrate panel, such as areas of the substrate panel that have already been exposed to ultraviolet (UV) light. In some examples, an illumination mask assembly can be coupled to a clamp assembly and used to image at least one edge region of the substrate panel, such as an edge region including one or more dummy patterns. For example, the substrate panel can be clamped using the clamp assembly in order to immerse the substrate panel into a plating bath. Before immersion, the illumination mask assembly can image one or more edge regions of the substrate panel, such as to image the various dummy patterns in a layer of the substrate panel.

In some aspects, this disclosure is directed to a panel edge patterning system for imaging an edge region of a substrate panel, the panel edge patterning system comprising means for selectively imaging at least one edge region of the substrate panel without imaging at least one other region of the substrate panel, such as to avoid regions of the substrate panel that have already been exposed to ultraviolet (UV) light.

In some aspects, this disclosure is directed to a panel edge patterning system for imaging an edge region of a substrate panel, the panel edge patterning system comprising: a clamp assembly configured to clamp at least one edge of the substrate panel; and an illumination mask assembly coupled to the clamp assembly and configured to expose a plurality of edge regions of the substrate panel.

In some aspects, this disclosure is directed to a method for imaging portions of a substrate panel, the method comprising: clamping a first edge of the substrate panel; and selectively imaging at least one edge of the substrate panel without imaging at least one other region of the substrate panel.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

It is often necessary to expose or image an edge of a substrate panel to a light source while performing panel substrate lithography and exposing IC patterns during semiconductor manufacturing. For example, it can be desirable to include various dummy patterns in one or more edge regions of the substrate panel, in addition to the IC patterns, in order to improve the current densities across the panel during a subsequent plating process. Typically, the panel edge exposure is performed by exposing a suitably sized chrome opening in the reticle, with or without a pattern.

The present inventors have recognized that this panel edge exposure operation takes a significant amount of time, which reduces throughput. In addition, the present inventors have recognized that the panel edge exposure operation wastes valuable reticle space, or worse, requires additional reticles. The present inventors have recognized a need for an improved panel edge exposure operation that solves these problems.

This disclosure describes various techniques to quickly image one or more edge regions of a substrate panel without imaging other regions of the substrate panel, such as areas of the substrate panel that have already been exposed to ultraviolet (UV) light. In some examples, an illumination mask assembly can be coupled to a clamp assembly and used to image at least one edge region of the substrate panel, such as an edge region including one or more dummy patterns. For example, the substrate panel can be clamped using the clamp assembly in order to immerse the substrate panel into a plating bath. Before immersion, the illumination mask assembly can image one or more edge regions of the substrate panel, such as to image the various dummy patterns in a layer of the substrate panel.

In other examples, a panel edge patterning system can be placed in conjunction with an air table and a robotic system such that, as a substrate panel approaches, the panel edge patterning system, portions of one or more light arrays of the illumination system can turn on and image one or more edge regions of the substrate panel as the substrate panel passes under (and/or over) the light arrays, without imaging other regions of the substrate panel, such as areas of the substrate panel that have already been exposed to UV light.

Figure 1:
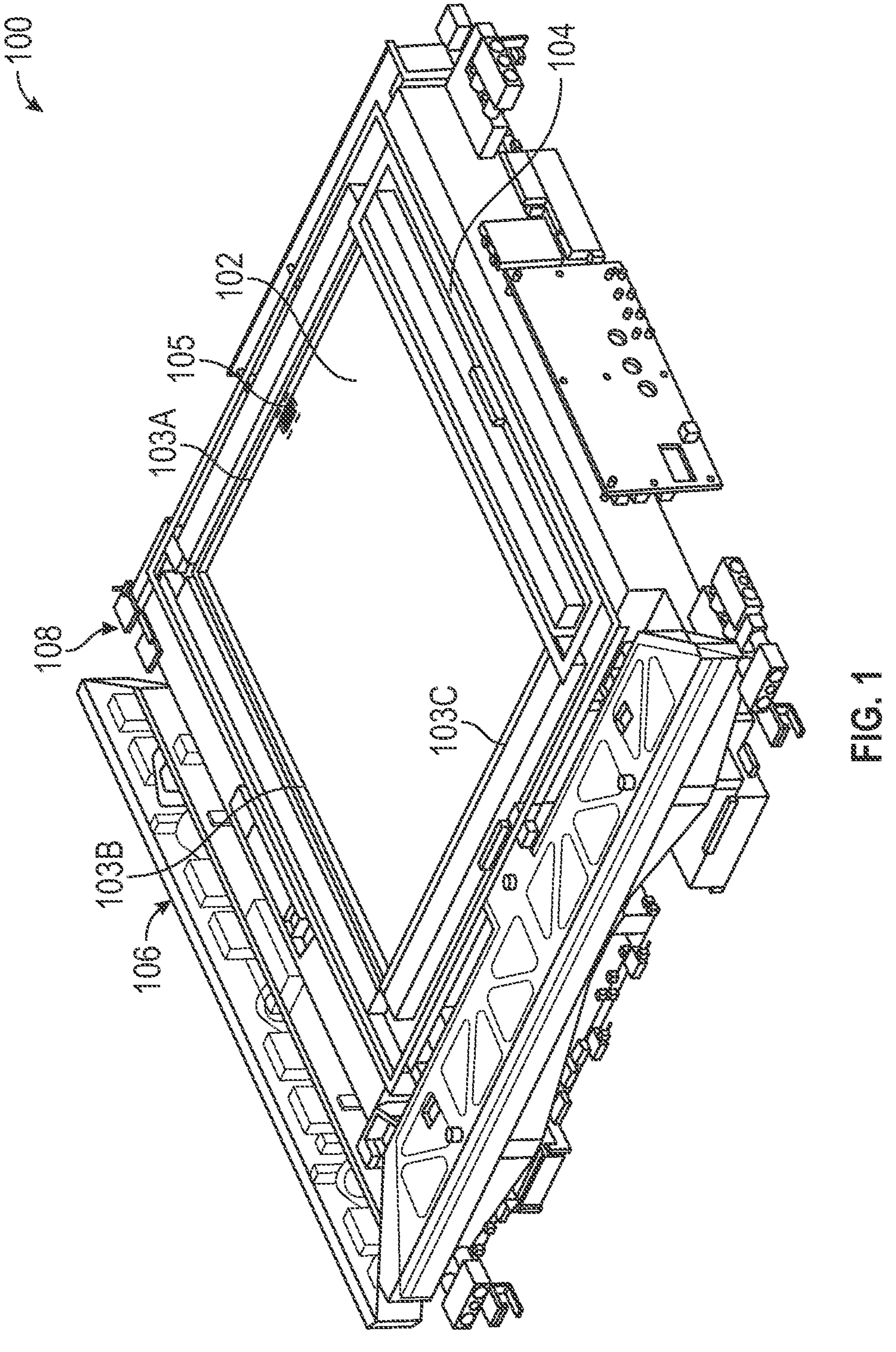
FIG. 1 depicts an example of a panel edge patterning system for imaging an edge region of a substrate panel.

FIG. 1 depicts an example of a panel edge patterning system 100 for imaging an edge region of a substrate panel 102. The panel edge patterning system 100 can include one or more clamp assemblies, such as a clamp assembly 104, positioned to clamp a corresponding edge of the substrate panel 102. Edge regions 103A-103C of the substrate panel 102 are shown in FIG. 1, with a fourth edge region 103D of the substrate panel 102 hidden from view (but shown in FIG. 4). In the example shown in FIG. 1, a dummy pattern 105 defined in a layer of the substrate panel 102 is located within the edge region 103A.

The panel edge patterning system 100 can include an XYZ stage assembly 106 having X, Y, and Y axis motors that are configured to adjust a position of the substrate panel 102 in one or more of the X, Y, and Z axes. The clamp assembly 104 can be coupled to the XYZ stage assembly 106. In addition, the panel edge patterning system 100 can include a theta drive 108 having a motor configured to adjust a position of a theta axis so as to further adjust the position of the substrate panel. In some examples, a support plate can assist in supporting the substrate panel 102.

Figure 2:
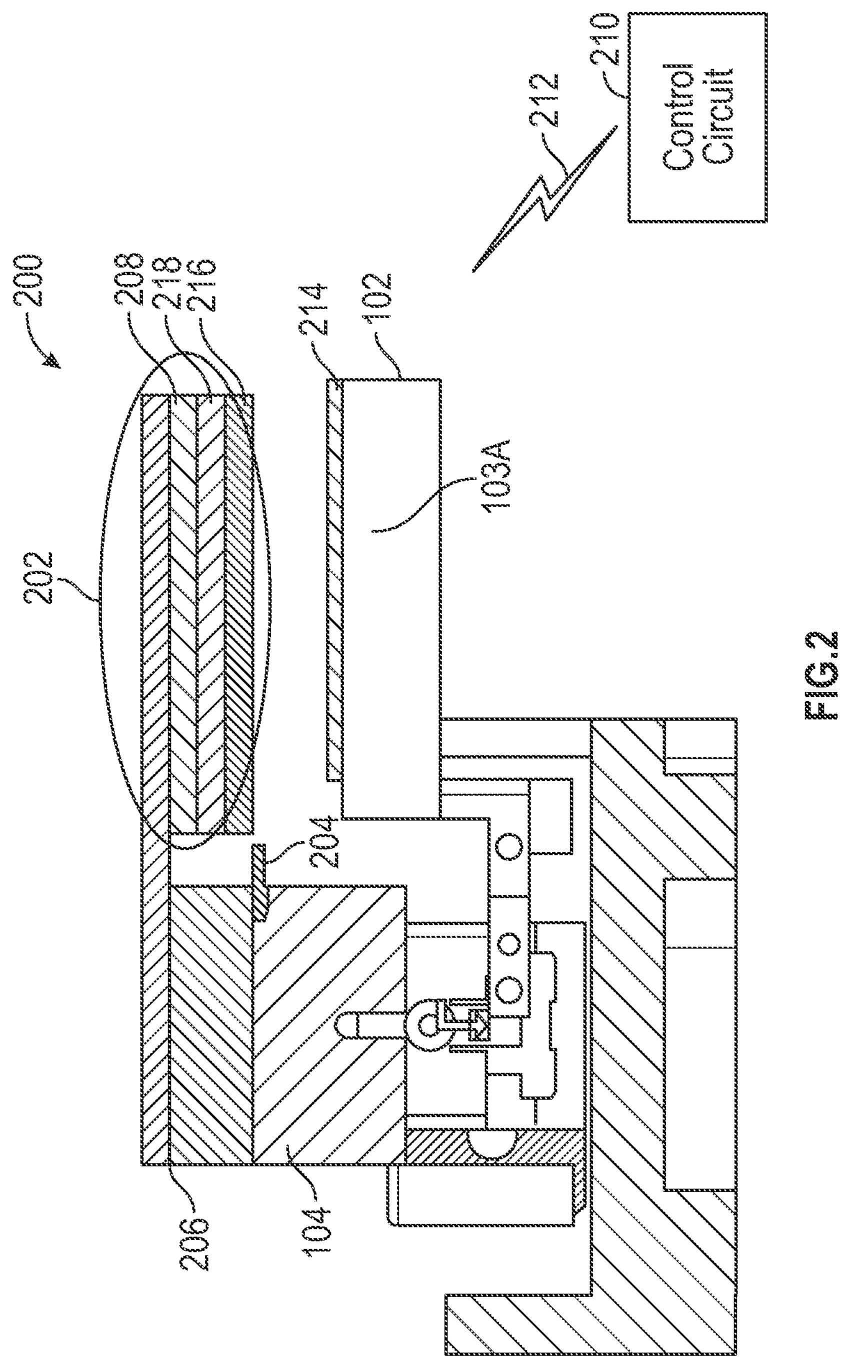
FIG. 2 is a cross-sectional view of a panel edge patterning system for imaging an edge region of a substrate panel.

As shown in more detail in FIG. 2, the panel edge patterning system 100 includes an illumination mask assembly coupled to the clamp assembly 104 of FIG. 1 and configured to image one or more edge regions of the substrate panel 102.

FIG. 2 is a cross-sectional view of a panel edge patterning system 200 for imaging an edge region of a substrate panel. In accordance with various techniques of this disclosure, the panel edge patterning system 200 includes an illumination mask assembly 202 that is configured to image, e.g., expose to a light source, one or more edge regions of a substrate panel 102, such as one or more of the edge regions 103A-103C of the substrate panel 102 of FIG. 1, without imaging other regions of the substrate panel 102, such as areas of the substrate panel that have already been exposed to ultraviolet (UV) light.

The illumination mask assembly 202 is coupled adjacent a clamp edge 204 of the clamp assembly 104, such as via a flange 206. As seen in FIG. 2, the flange 206 extends outwardly from the clamp assembly 104 and above the substrate panel 102. The clamp assembly 104 in FIG. 2 is shown in an unclamped position.

The illumination mask assembly 202 is coupled to the flange 206 such that the illumination mask assembly 202 extends above the substrate panel 102. The illumination mask assembly 202 includes a light array 208 coupled to the flange 206. In some examples, the light array 208 can be coupled to an underside of the flange 206.

In some examples, the light array 208 includes a plurality of light emitting diodes (LEDs), such as UV LEDs. The light array 208 can be in electrical communication with a control circuit 210, where the electrical communication is represented by a lightning bolt 212 in FIG. 2. The electrical communication can be a wired or wireless connection.

In some examples, the light array 208 can include wavelength-specific light sources, such as LEDs, that the control circuit 210 can turn on to be compatible with a particular type of photoresist material 214 on the substrate panel 102. By way of a non-limiting example, a light array 208 can include four rows of LEDs, where each row includes LEDs configured to emit light having a specific wavelength that is different from the wavelength of light emitted by the other rows of LEDs, and where each row is selectable by the control circuit 210. In other examples, multiple rows of LEDs can be grouped together, where each group of LEDs is configured to emit light having a specific wavelength that is different from the wavelength of light emitted by the other groups of rows of LEDs, and where each group of rows is selectable by the control circuit 210.

In some examples, the control circuit 210 can adjust or otherwise configure a wavelength of the light emitted by the light array 208 to correspond with a photoresist material 214 on the substrate panel 102. For example, the control circuit 210 can include processing circuitry to control a wavelength of a plurality of light emitting diodes forming at least part of the light array 208 to be compatible with a particular type of photoresist material 214 on the substrate panel 102.

The illumination mask assembly 202 can include a mask assembly 216 coupled to the light array 208, e.g., an underside of the light array 208. The mask assembly 216 can include at least one opening through which light from the light array 208 passes to image the one or more edge regions, such as the edge region 103A, of the substrate panel 102. In some examples, the mask assembly 216 can include a metallic material, e.g., stainless steel. In other examples, the mask assembly 216 can include a non-metallic material, e.g., glass.

In some implementations, the mask assembly 216 can be one of several mask assemblies that can be selected for use with a particular substrate panel 102 specific to a customer's IC design. By using a flange 206 that is removably coupled to the clamp assembly 104, when finished manufacturing substrate panels for a first customer, the entire illumination mask assembly 202 can be replaced with one having a different mask assembly 216 that is specific to a second customer. In some examples, a robot can remove the illumination mask assembly 202 and replace it with another illumination mask assembly. In other examples, the illumination mask assembly 202 can be manually removed and replaced by manufacturing personnel.

In some examples, a proximity between the illumination mask assembly 202 and the substrate panel 102 is adjustable. For example, a thickness of the flange 206 can vary between the selectable illumination mask assemblies 202 such that a proximity of the illumination mask assembly 202 to the photoresist material 214 can be controlled and adjusted, such as to account for specific features of the substrate panel 102, e.g., the size of the vias of the substrate panel 102.

Similarly, in another example, a thickness of the mask assembly 216 can vary between the selectable illumination mask assemblies 202 such that a proximity of the illumination mask assembly 202 to the photoresist material 214 can be controlled and adjusted, such as to account for specific features of the substrate panel 102, e.g., the size of the vias of the substrate panel 102.

In some examples, the illumination mask assembly 202 can include a diffuser 218 coupled between the light array 208 and the mask assembly 216. The diffuser 218 can help evenly distribute light from the light array 208, such as when the light array 208 includes LEDs, which can each act as a point source of light.

Figure 3:
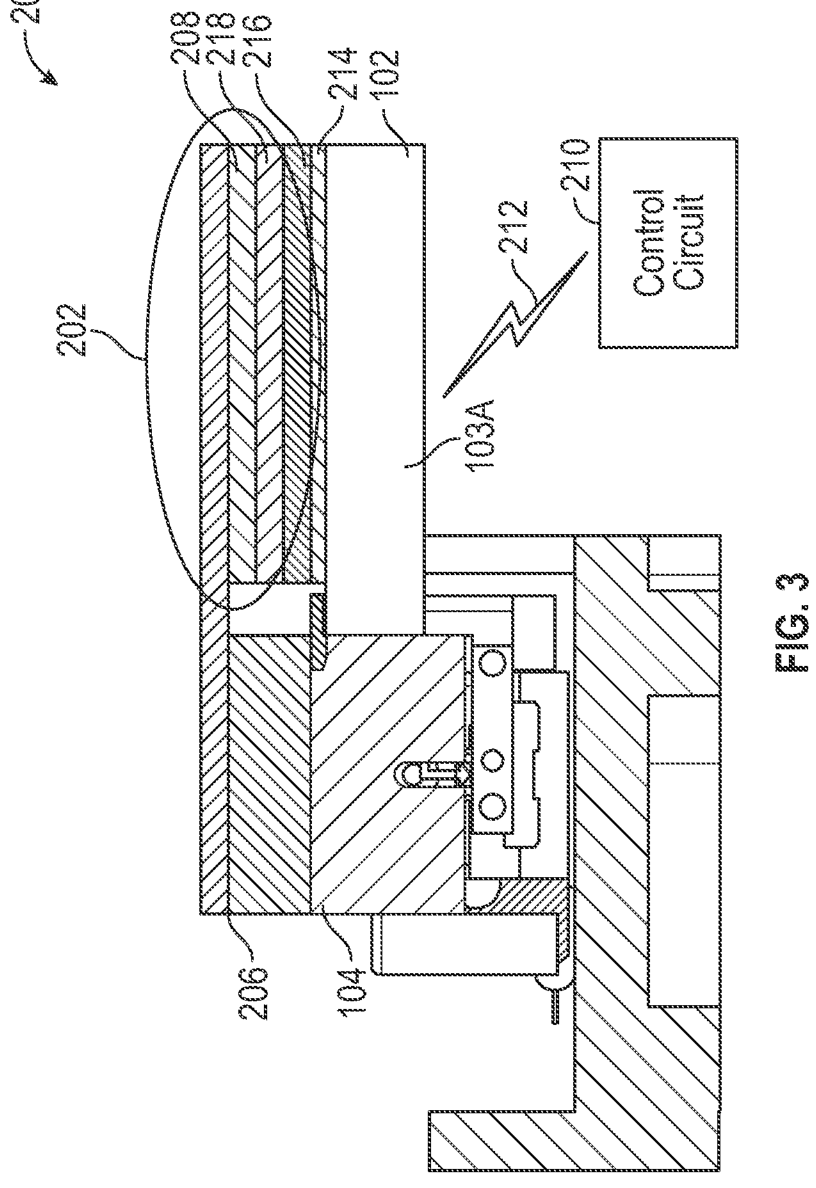
FIG. 3 is a cross-sectional view of a panel edge patterning system for imaging an edge region of a substrate panel with the clamp assembly shown in a clamped position.

FIG. 3 is a cross-sectional view of a panel edge patterning system 200 for imaging an edge region of a substrate panel with the clamp assembly 104 shown in a clamped position. As seen in FIG. 3, when in the clamped position, the proximity between the illumination mask assembly 202 and the substrate panel 102 is reduced such that the mask assembly 216 is closer to the photoresist material 214.

In this manner, the illumination mask assembly 202 can image one or more edge regions of the substrate panel 102, such as to image the various dummy patterns in a layer of the substrate panel 102, thereby improving throughput.

To pattern dummy patterns, e.g., via holes or lines/spaces, at the panel edges, the clamp assembly 104 can utilize either a stainless steel or glass masking technique. In the case of stainless steel or other suitable opaque material, the patterned material can act as a "stencil" or "shadow mask" that would be used for large geometry features or as a simple aperture to provide the user with the ability to clear, or cross link, large areas of photoresist without penumbra effects.

For the glass masking technique, the glass can include a layer of patterned chrome or other suitable opaque film pattern on the glass surface closest to the photoresist. By varying the proximity of the glass/chrome pattern, effectively a photomask, with respect to the surface of the photoresist, improved resolution, possibly 2 to 3 μm line/space and 5 μm vias can be realized.

As mentioned above, an illumination system can be placed on an air table such that, as a substrate panel approaches the illumination system, portions of one or more light arrays of the illumination system can turn on and image one or more edge regions of the substrate panel as the substrate panel passes under (and/or over) the light arrays. An example is shown in FIG. 4.

Figure 4:
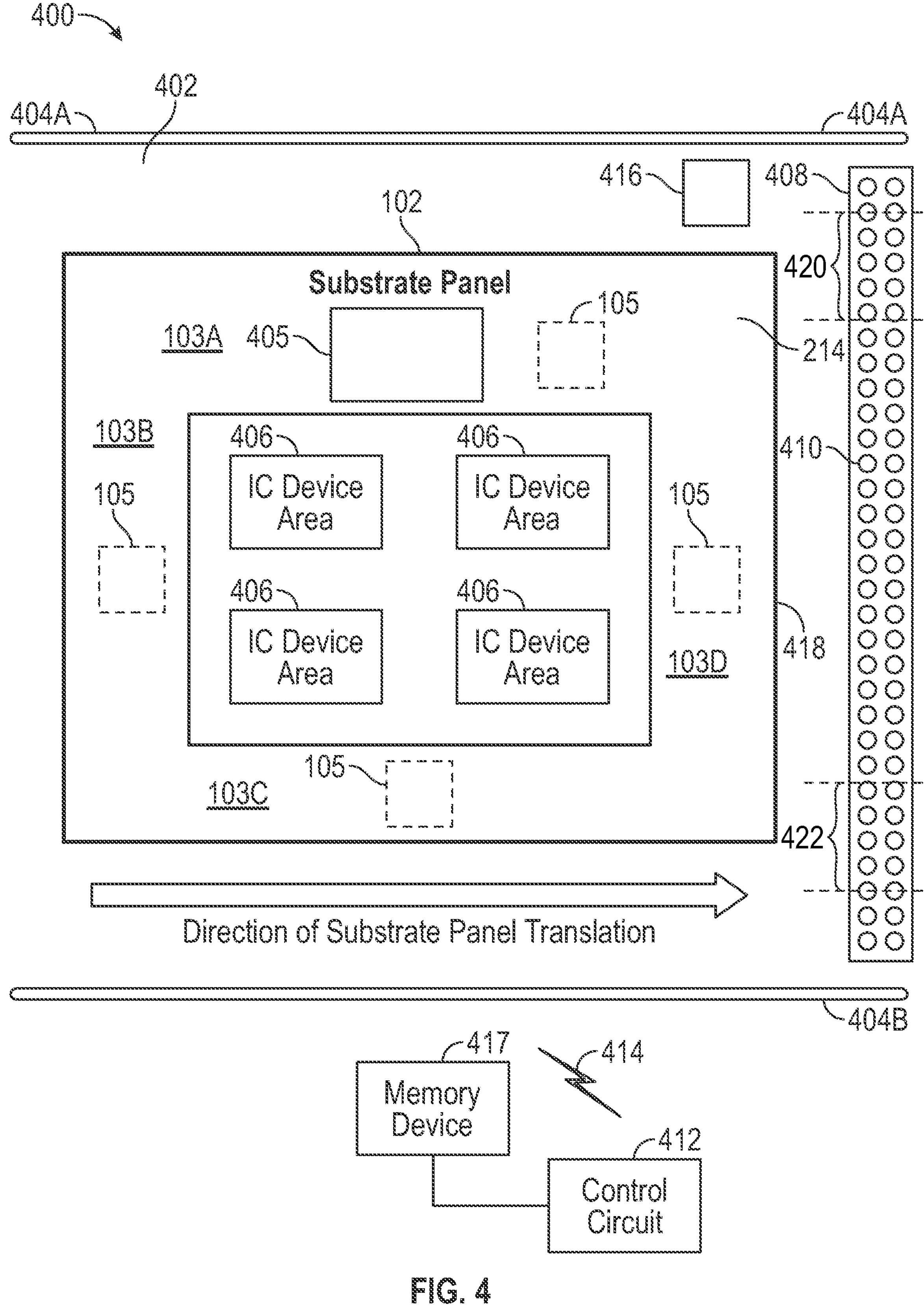
FIG. 4 is a top view of another example of a panel edge patterning system for imaging an edge region of a substrate panel.

FIG. 4 is a top view of another example of a panel edge patterning system for imaging an edge region of a substrate panel. The panel edge patterning system 400 can selectively image, e.g., expose to UV light, one or more edge regions of a substrate panel without imaging other regions of the substrate panel, such as areas of the substrate panel that have already been exposed to ultraviolet (UV) light. The panel edge patterning system 400 can include an air table 402 upon which a substrate panel 102 is conveyed between sides 404A and 404B, such as by a robotic mechanism. In the example shown, the substrate panel 102 is moved over the air table 402 from left to right.

The substrate panel 102 can include one or more dummy patterns 105 positioned within a layer of the substrate panel 102 and within one or more of the edge regions 103A-103D. The substrate panel 102 can include one or more IC device areas 406, such as located within in a central portion of the substrate panel 102, where the one or more IC device areas 406 have already been exposed to UV light.

The panel edge patterning system 400 includes one or more light arrays 408 having a one or more light sources. In some examples, the light array(s) 408 can include a plurality of LEDs 410, e.g., UV LEDs. The light array(s) 408 can be in electrical communication with a control circuit 412, the electrical communication represented by a lightning bolt 414 in FIG. 4. The electrical communication can be a wired or wireless connection.

In other examples, the one or more light arrays 408 can include wavelength-specific light sources, such as LEDs, that the control circuit 412 can turn on to be compatible with a particular type of photoresist material 214 on the substrate panel 102. By way of a non-limiting example, a light array 408 can include four rows of LEDs, where each row includes LEDs having a specific wavelength that is different from the wavelength of light emitted by the other rows of LEDs, and where each row is selectable by the control circuit 412. In other examples, multiple rows of LEDs can be grouped together, where each group of LEDs is configured to emit light having a specific wavelength that is different from the wavelength of light emitted by the other groups of rows of LEDs, and where each group of rows is selectable by the control circuit 210.

In other examples, the control circuit 412 can adjust or otherwise configure a wavelength of the light emitted by the light array(s) 408 to correspond with a photoresist LEDs on the substrate panel 102. For example, the control circuit 210 can include processing circuitry to control, e.g., tune, a wavelength of a plurality of LEDs forming at least part of the light array(s) 408 to be compatible with a particular type of photoresist material 214 on the substrate panel 102.

As the substrate panel 102 moves over the air table 402, e.g., by a robotic mechanism, toward the light array(s) 408, one or more panel detectors 416 detect a presence of the substrate panel 102 and, in response, the control circuit 412 controls the light array(s) 408 to turn on one or more of the light sources, e.g., LEDs. In some examples, the panel detector(s) 416 can include a sensor. In other examples, the panel detector(s) 416 can include a camera.

In some examples, the one or more IC device areas 406 of the substrate panel 102 have already been exposed as the substrate panel 102 approaches the light array(s) 408. As such, it can be undesirable to expose the one or more IC device areas 406 a second time. To prevent the one or more IC device areas 406 from being exposed a second time, the control circuit 412 can control specific light sources of the light array(s) 408 to turn on or remain off. For example, the dimensions of the substrate panel 102, including the dimensions of the edge regions 103A-103D, e.g., length and width of the edge regions, can be stored in a memory device 417 and used by the control circuit 412 to control which ones of the LEDs 410 turn on or remain off as the substrate panel 102 passes under (or above) the light array(s) 408.

For example, the control circuit 412 can control all of the LEDs to turn on as the leading edge 418 passes under the light array 408, as detected by the one or more panel detectors 416. Then, using the stored dimensions of the edge regions, the control circuit can control the LEDs 410 in regions 420, 422 of the light array to remain on and turn off the LEDs in the region between the regions 420, 422 (the LEDs in the central portion of the light array 408) to prevent the one or more IC device areas 406 from being further exposed. Finally, using the stored dimensions of the edge regions, the control circuit can control all of the LEDs to turn on to expose the edge region 103B.

The memory device 417 can store dimensions for each different substrate panel 102 manufactured for a particular customer. Then, during a manufacturing run, the control circuit 412 can retrieve from the memory device 417 the dimensions associated with the substrate panel 102 currently being manufactured.

Figure 5:
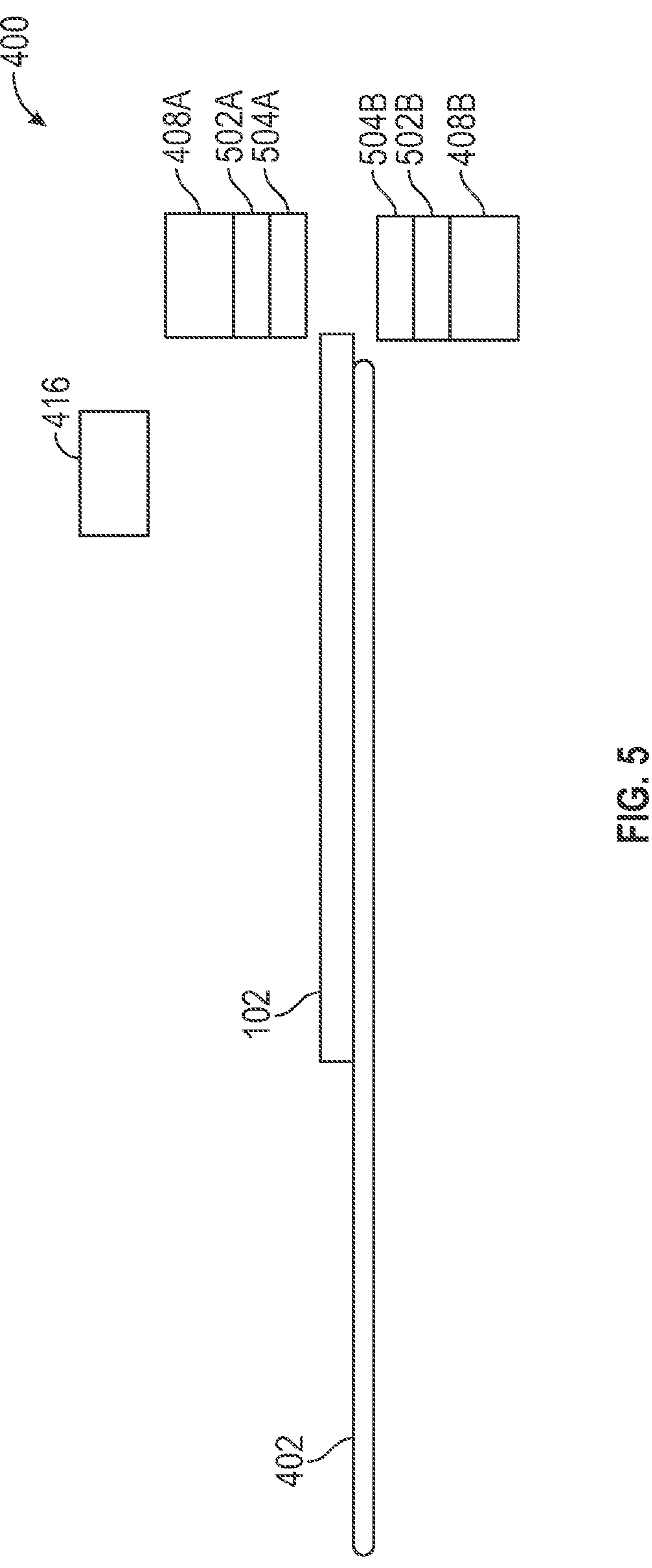
FIG. 5 is a side view of an example of the illumination system of FIG. 4.

FIG. 5 is a side view of an example of the illumination system of FIG. 4. As seen in FIG. 5, the panel edge patterning system 400 includes an upper light array 408A and a lower light array 408B. Each of the light arrays 408A, 408B can be examples of the light array 408 in FIG. 4. The upper light array 408A can image the top of the substrate panel 102 and the lower light array 408B can image the bottom of the substrate panel 102, as needed. The upper light array 408A and the lower light array 408B can operate light a light curtain, for example.

As described above with respect to FIG. 2, the panel edge patterning system 400 can include a diffuser to the light array. For example, a diffuser 502A can help evenly distribute light from the upper light array 408A, such as when the upper light array 408A includes LEDs, which can each act as a point source of light. Similarly, a diffuser 502B can help evenly distribute light from the lower light array 408B.

In addition, like the configuration described above with respect to FIG. 2, the panel edge patterning system 400 can further include a mask assembly coupled to the light array, e.g., an under the light array. For example, a mask assembly 504A can be coupled between the upper light array 408A and the substrate panel 102, such as to an underside of the diffuser 502A. The mask assembly 504A can include at least one opening through which light from the upper light array 408A passes to image the one or more edge regions, such as the edge region 103A of the substrate panel 102 of FIG. 4. Similarly, a mask assembly 504B can be coupled between the lower light array 408B and the substrate panel 102, such as to a topside of the diffuser 502B. In some implementations, the mask assemblies can be one of several mask assemblies that can be selected for use with a particular substrate panel 102 specific to a customer's IC design.

In some examples, the mask assemblies can be used to pattern product information 405 of FIG. 4, such as a serial number, product ID, and/or date of manufacture, as well as other information. Either or both of the mask assembly 504A and the mask assembly 504B can include openings that can be used to "stamp" the product information 405 onto one or more of the edge regions 103A-103D of FIG. 4.

In some examples, a height of the upper light array 408A above the substrate panel 102 can be adjustable to account for varying thicknesses between substrate panel 102.

Various Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The invention claimed is:

1. A panel edge patterning system for imaging one or more edge regions of a substrate panel, the panel edge patterning system comprising:

a clamp assembly configured to clamp at least one edge of the substrate panel; and an illumination mask assembly coupled to the clamp assembly and configured to expose at least one edge region of a plurality of edge regions of the substrate panel, the illumination mask assembly comprising:

a first light array including a first plurality of light sources positioned on a first side of the substrate panel and configured to illuminate the first side of the substrate panel;

a first mask assembly positioned between the first light array and the first side of the substrate panel and including at least one opening through which light from the first light array passes to image the at least one edge region on the first side of the substrate panel;

a second light array including a second plurality of light sources positioned on a second side of the substrate panel opposite the first side and configured to illuminate the second side of the substrate panel; and a second mask assembly positioned between the second light array and the second side of the substrate panel and including at least one opening through which light from the second light array passes to image the at least one edge region on the second side of the substrate panel.

2. The panel edge patterning system of claim 1, wherein the clamp assembly includes a flange that extends above the substrate panel, and wherein the first light array is coupled to the flange; and the first mask assembly is coupled to an underside of the first light array.

3. The panel edge patterning system of claim 2, wherein the first mask assembly is selected from a group of mask assemblies.

4. The panel edge patterning system of claim 2, wherein a proximity of the first mask assembly relative to the substrate panel is adjustable.

5. The panel edge patterning system of claim 2, wherein the first mask assembly includes a metallic material.

6. The panel edge patterning system of claim 2, wherein the first mask assembly includes a non-metallic material.

7. The panel edge patterning system of claim 6, wherein the non-metallic material includes glass.

8. The panel edge patterning system of claim 2, wherein the illumination mask assembly further includes a diffuser coupled between the first light array and the first mask assembly.

9. The panel edge patterning system of claim 2, wherein the first light array includes a plurality of light emitting diodes.

10. The panel edge patterning system of claim 9, wherein a wavelength of the plurality of light emitting diodes is configurable to correspond with a photoresist material on the substrate panel.

11. The panel edge patterning system of claim 1, wherein the at least one edge region of the substrate panel includes at least one dummy pattern defined in a layer of the substrate panel.

12. The panel edge patterning system of claim 1, further comprising:

a controller communicatively coupled to the illumination mask assembly, the controller configured to selectively turn on and off individual light sources of the first plurality of light sources based on which region of the substrate panel to be exposed and which region is not to be exposed.

13. The panel edge patterning system of claim 1, wherein the illumination mask assembly is configured to image a dummy pattern on the at least one edge region to improve current density prior to a plating process.

14. The panel edge patterning system of claim 1, wherein the first light array and the second light array operate a light curtain.

15. A method for imaging portions of a substrate panel, the method comprising:

clamping, by a clamp assembly, a first edge of the substrate panel; and selectively imaging, by an illumination mask assembly coupled to the clamp assembly, at least one edge region of the substrate panel without imaging at least one other region of the substrate panel, the selectively imaging comprising:

illuminating a first side of the substrate panel with a first light array positioned on the first side of the substrate panel;

directing light from the first light array through at least one opening in a first mask assembly positioned between the first light array and the first side of the substrate panel to image the at least one edge region on the first side of the substrate panel;

illuminating a second side of the substrate panel with a second light array positioned on the second side of the substrate panel; and directing light from the second light array through at least one opening in a second mask assembly positioned between the second light array and the second side of the substrate panel to image the at least one edge region of on the second side of the substrate panel.

16. The method of claim 15, wherein the at least one other region was previously exposed to ultraviolet (UV) light.

17. The method of claim 15, wherein imaging the at least one edge of the substrate panel includes:

exposing a plurality of edge regions of the substrate panel.

18. The method of claim 15, further comprising:

selecting the first mask assembly from a group of mask assemblies.

19. The method of claim 15, further comprising:

adjusting a proximity of the first mask assembly relative to the substrate panel.

20. The method of claim 15, further comprising:

diffusing the light between the first light array and the first mask assembly.

21. The method of claim 15, wherein the first light array includes a plurality of light emitting diodes.

22. The method of claim 21, further comprising:

adjusting a wavelength of the plurality of light emitting diodes to correspond with a photoresist material on the substrate panel.

23. A panel edge patterning system for imaging an edge region of a substrate panel, the panel edge patterning system comprising:

means for selectively imaging at least one edge region of the substrate panel without imaging at least one other region of the substrate panel, such as to avoid regions of the substrate panel that have already been exposed to ultraviolet (UV) light, wherein the means comprises an illumination mask assembly coupled to a clamp assembly, the illumination mask assembly comprising:

a first light array including a first plurality of light sources positioned on a first side of the substrate panel and configured to illuminate the first side of the substrate panel;

a first mask assembly positioned between the first light array and the first side of the substrate panel and including at least one opening through which light from the first light array passes to image the at least one edge region on the first side of the substrate panel;

a second light array including a second plurality of light sources positioned on a second side of the substrate panel opposite the first side and configured to illuminate the second side of the substrate panel; and a second mask assembly positioned between the second light array and the second side of the substrate panel and including at least one opening through which light from the second light array passes to image the at least one edge region on the second side of the substrate panel.

* * * * *